(12) United States Patent
Jeon et al.

(10) Patent No.: US 8,193,703 B2
(45) Date of Patent: Jun. 5, 2012

(54) ORGANIC LIGHT EMITTING DIODE DISPLAY THAT DIRECTS REFLECTED LIGHT TO IMPROVE VISIBILITY

(75) Inventors: Hee-Chul Jeon, Yongin (KR); Woo-Suk Jung, Yongin (KR); Soon-Ryong Park, Yongin (KR); Eun-Ah Kim, Yongin (KR); Chul-Woo Jeong, Yongin (KR); Hee-Seong Jeong, Yongin (KR); Noh-Min Kwak, Yongin (KR); Joo-Hwa Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 248 days.

(21) Appl. No.: 12/478,639

(22) Filed: Jun. 4, 2009

(65) Prior Publication Data

US 2010/0052520 A1    Mar. 4, 2010

(30) Foreign Application Priority Data

Aug. 26, 2008  (KR) .................. 10-2008-0083396

(51) Int. Cl.
*H01L 51/50* (2006.01)
*H01L 51/52* (2006.01)

(52) U.S. Cl. ........ 313/506; 313/504; 313/509; 313/512; 362/311.06; 362/311.01; 362/336; 362/339; 362/317; 257/98

(58) Field of Classification Search .......... 313/498–512; 362/317, 322, 339, 336–337, 311.01, 311.06, 362/540–542, 545, 516–519; 298/98–99
See application file for complete search history.

(56) References Cited

U.S. PATENT DOCUMENTS

| | | | | |
|---|---|---|---|---|
| 3,957,616 | A * | 5/1976 | Montgomery | 204/281 |
| 5,272,562 | A * | 12/1993 | Coderre | 359/529 |
| 5,315,491 | A * | 5/1994 | Spencer et al. | 362/84 |
| 6,142,643 | A * | 11/2000 | Araki et al. | 362/84 |
| 6,375,776 | B1 * | 4/2002 | Buoni et al. | 156/209 |
| 6,657,766 | B2 | 12/2003 | Minoura et al. | |
| 7,515,123 | B2 * | 4/2009 | Shirasaki | 345/76 |
| 2004/0043234 | A1 * | 3/2004 | Hay et al. | 428/496 |
| 2004/0263441 | A1 * | 12/2004 | Tanaka et al. | 345/76 |
| 2007/0001182 | A1 * | 1/2007 | Schardt et al. | 257/98 |
| 2007/0031641 | A1 * | 2/2007 | Frisch et al. | 428/172 |
| 2007/0209244 | A1 * | 9/2007 | Prollius et al. | 40/209 |
| 2007/0257609 | A1 * | 11/2007 | Fukuda et al. | 313/506 |
| 2010/0117524 | A1 * | 5/2010 | Hente et al. | 313/504 |

FOREIGN PATENT DOCUMENTS

| | | |
|---|---|---|
| JP | 2002-139729 | 5/2002 |
| JP | 2004-045487 | 1/2004 |
| KR | 10-2003-0045707 | 6/2003 |

* cited by examiner

*Primary Examiner* — Anne Hines
*Assistant Examiner* — Jose M Diaz
(74) *Attorney, Agent, or Firm* — Christie, Parker & Hale, LLP

(57) ABSTRACT

An OLED display includes a first substrate including a thin film transistor and an OLED, and a second substrate on the first substrate and including a corner-cube pattern facing the first substrate.

18 Claims, 7 Drawing Sheets

ORGANIC LIGHT EMITTING DIODE DISPLAY THAT DIRECTS REFLECTED LIGHT TO IMPROVE VISIBILITY

CROSS-REFERENCE TO RELATED APPLICATION

This application claims priority to and the benefit of Korean Patent Application No. 10-2008-0083396 filed in the Korean Intellectual Property Office on Aug. 26, 2008, the entire contents of which are incorporated herein by reference.

BACKGROUND OF THE INVENTION

1. Field of the Invention

The present invention relates to an organic light emitting diode (OLED) display. More particularly, it relates to an OLED display having improved visibility.

2. Description of the Related Art

An OLED display includes a plurality of organic light emitting diodes (OLEDs) including hole injection electrodes, an organic light emission layer, and electron injection electrodes. Light is emitted by energy released when excitons, generated when electrons and holes are combined, drop from an excited state to a ground state, and the OLED display displays an image by using the light.

Accordingly, an OLED display has self-luminance characteristics, and unlike a liquid crystal display (LCD), the OLED display's thickness and weight can be reduced since a separate light source is not required. Further, because OLED displays have high quality characteristics, such as low power consumption, high luminance, and fast response times, OLED displays are appropriate for use in mobile electronic devices.

In general, the hole injection electrode, the electron injection electrode, and other metal wires of the OLED display can reflect external light. When the OLED display is used in a bright place, expression of black color and contrast are deteriorated due to reflection of external light, thereby deteriorating visibility of the OLED display.

The above information disclosed in this Background section is only for enhancement of understanding of the background of the invention, and therefore may contain information that does not form the prior art that is already known in this country to a person of ordinary skill in the art.

SUMMARY OF THE INVENTION

Exemplary embodiments of the present invention provide an organic light emitting diode (OLED) display having improved visibility.

An exemplary OLED display according to an embodiment of the present invention includes a first substrate including a thin film transistor and an OLED, and a second substrate on the first substrate and including a corner-cube pattern facing the first substrate.

The corner-cube pattern may include a plurality of trihedrons protruding toward the first substrate.

The OLED display may further include a gap including a gas between the first and second substrates, wherein the gas may be in contact with the corner-cube pattern, and wherein a refractive index of the second substrate may be greater than a refractive index of the gas.

The OLED display may further include a filler between the first and second substrates and in contact with the corner-cube pattern, wherein a refractive index of the filler may be less than a refractive index of the second substrate.

The OLED of the first substrate may display an image by emitting light toward the second substrate.

The first substrate may further include a plurality of pixels, each of the plurality of pixels including a corresponding OLED and a boundary around the corresponding OLED, wherein the second substrate may further include a light blocker covering the boundaries of the plurality of pixels.

The light blocker may face the first substrate.

In the OLED display, the first substrate may further include a planarization layer between the thin film transistor and the OLED, wherein the planarization layer may have a gray or dark-based color.

The corner-cube pattern may be configuerd to reflect incident light back in a direction substantially parallel to a direction of the incident light.

A pixel of an exemplary OLED display according to another embodiment of the present invention includes: a first substrate including a thin film transistor, a planarization layer on the thin film transistor, an OLED on the planarization layer and a boundary around the OLED; and a second substrate on the first substrate and including a corner-cube pattern facing the first substrate.

DETAILED DESCRIPTION OF THE EMBODIMENTS

Figure 1:
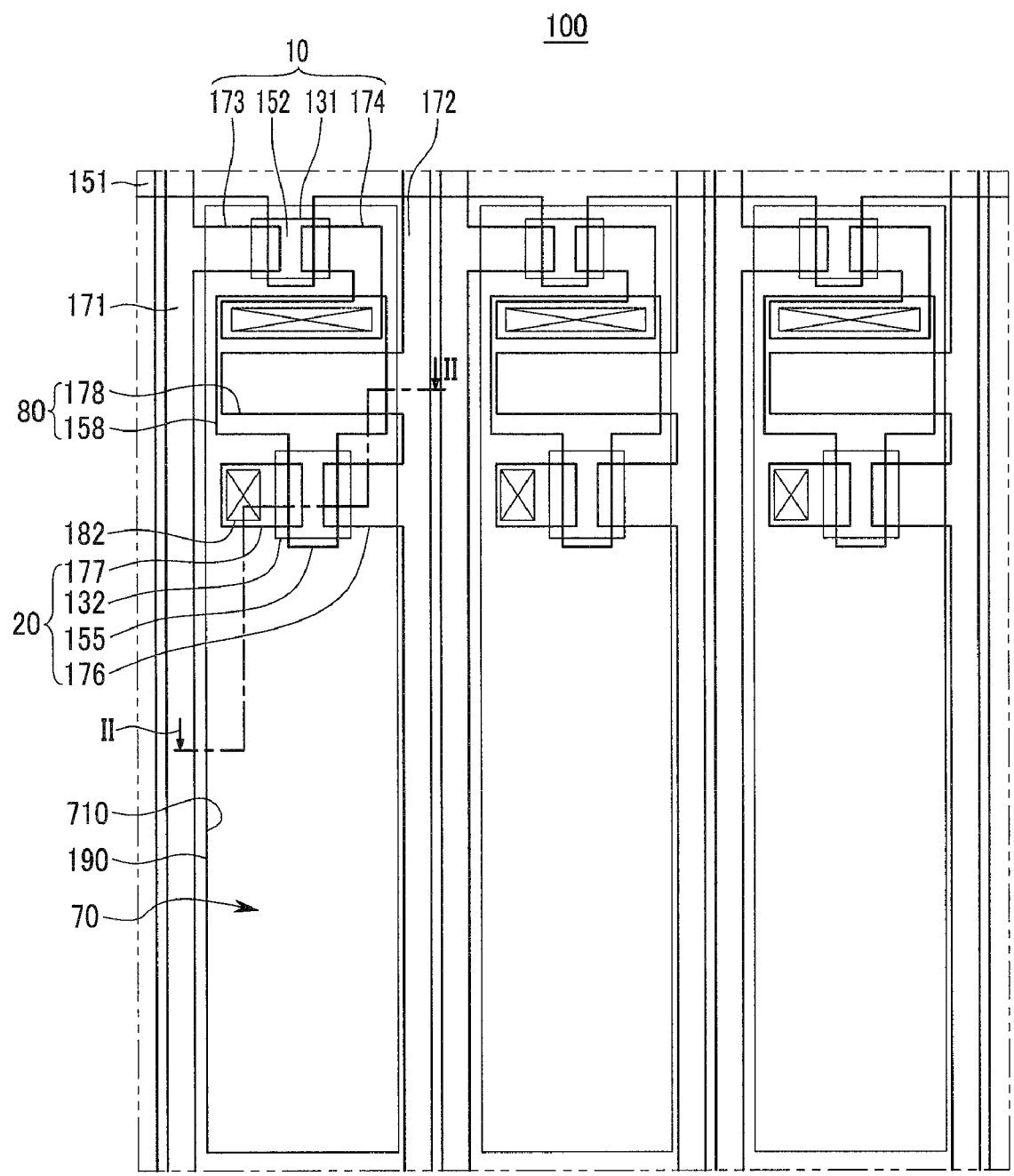
FIG. 1 is a layout view of an organic light emitting diode (OLED) display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, the size and thickness of each element in the drawings are samples for better understanding and ease of description, and the present invention is not limited thereto.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element, or one or more intervening elements may also be present.

Therefore, the drawings and description are to be regarded as illustrative in nature and not restrictive.

In the several exemplary embodiments, constituent elements having the same configuration are representatively described in a first exemplary embodiment by designating like constituent elements thereto, and other exemplary embodiments may be described more specifically with respect to differences from the first exemplary embodiment.

In addition, in the accompanying drawings, an organic light emitting diode (OLED) display is illustrated as an active matrix (AM)-type OLED display in a 2Tr-1Cap structure in which two thin film transistors (TFTs) and one capacitor are formed in one pixel, but the present invention is not limited thereto. Therefore, the OLED display may have various structures. For example, three or more TFTs and/or two or more capacitors may be provided in one pixel of the OLED display, and separate wires may further be provided in the OLED display. Here, the pixel refers to a minimum unit for displaying an image, and the OLED display displays an image by using a plurality of pixels.

Hereinafter, a first exemplary embodiment of the present invention will be described in further detail with reference to FIG. 1 and FIG. 2.

Figure 2:
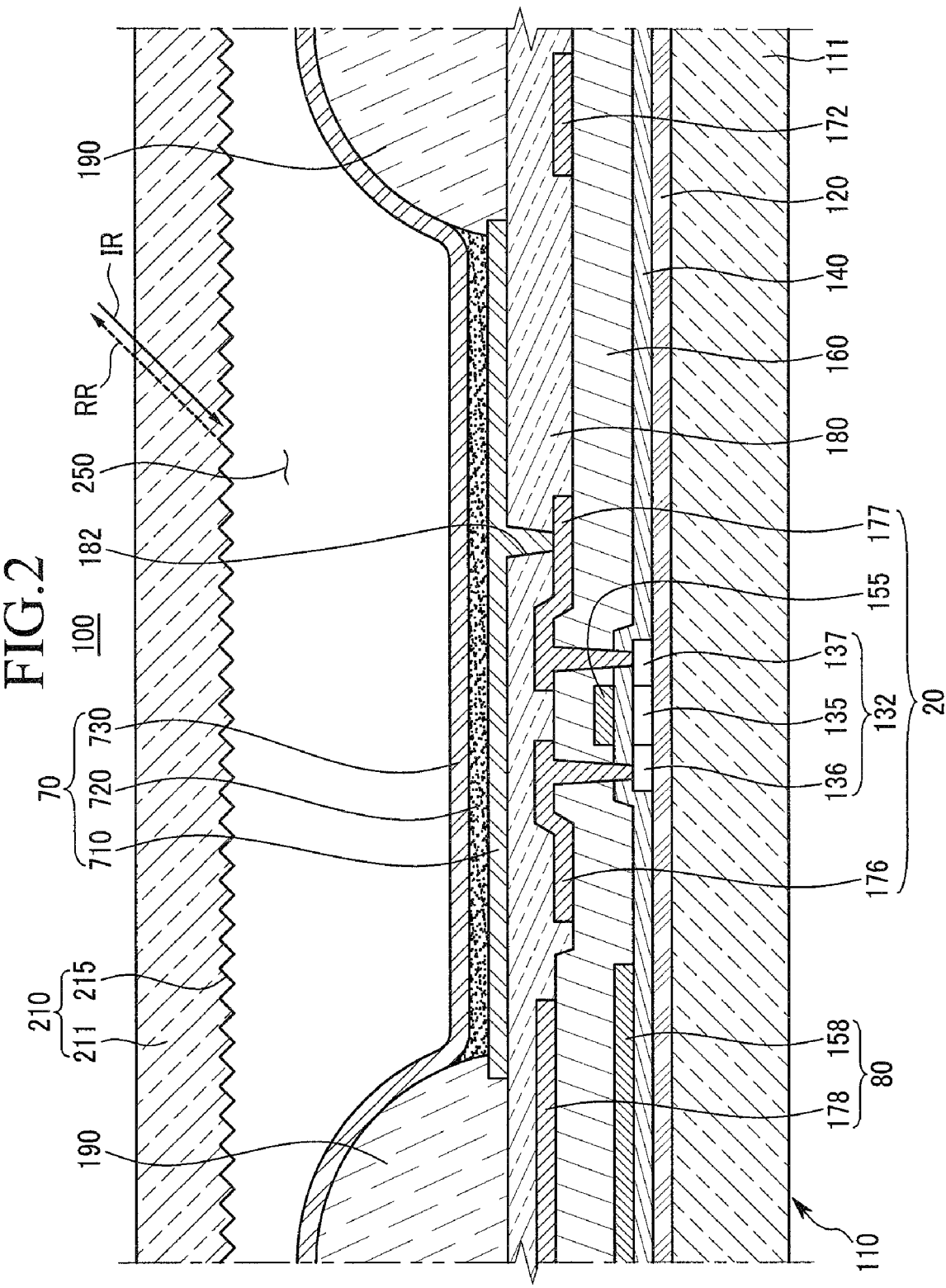
FIG. 2 is a cross-sectional view of FIG. 1, taken along the line II-II.

As shown in FIG. 1 and FIG. 2, an organic light emitting diode (OLED) display 100 includes a first substrate 110 (e.g., a display substrate) and a second substrate 210 (e.g., an encapsulation substrate). FIG. 1 is a layout view of a pixel structure, focusing on the first substrate 110. FIG. 2 is a cross-sectional view of the first and second substrates 110 and 210 of FIG. 1, taken along the line II-II.

The first substrate 110 includes a switching thin film transistor 10, a driving thin film transistor 20, a capacitor 80, and an organic light emitting diode (OLED) 70 for each pixel on a first substrate member 111. In addition, the first substrate 110 further includes gate lines 151 disposed along one direction, and data lines 171 and common power lines 172 that respectively cross the gate lines 151 and are insulated therefrom. Here, one pixel may be defined by a boundary including gate lines 151, a data line 171, and a common power line 172, but it is not limited thereto.

The OLED 70 includes a pixel electrode 710, an organic emission layer 720 formed on the pixel electrode 710, and a common electrode (730 of FIG. 2) formed on the organic emission layer 720. Here, the pixel electrode 710 is a positive (+) electrode which is a hole injection electrode, and the transflective common electrode 730 is a neagtive (−) electrode which is an electron injection electrode. However, the present invention is not limited thereto. Thus, the pixel electrode 710 may be the negative electrode and the common electrode 730 may be the positive electrode according to an alternate driving method of the OLED display 100. Holes and electrons are respectively injected from the pixel electrode 710 and the common electrode 730 into the organic emission layer 720, and form excitons. When the excitons change from an excited state to a base state, light is emitted.

In addition, in the OLED display 100 according to the first exemplary embodiment of the present invention, the OLED 70 displays an image by emitting light toward a direction away from the pixel electrode, that is, toward the common electrode 730, from the organic emission layer 720. That is, the OLED display 100 is formed as a top light emitting type.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The capacitor 80 includes a first capacitive plate 158 and a second capacitive plate 178 with an interlayer insulation layer 160 interposed therebetween. Here, the interlayer insulation layer may include a dielectric material. Capacitance of the capacitor 80 is determined by charges charged in the capacitor 80, that is, a voltage between the first and second capacitive plates 158 and 178.

The switching thin film transistor 10 is used as a switch for selecting a pixel to be light-emitted. The switching gate electrode 152 is connected to the gate line 151. The switching source electrode 173 is connected to the data line 171. The switching drain electrode 174 is disposed at a distance from the switching source electrode 173 and is connected to the first capacitive plate 158.

The driving thin film transistor 20 applies driving power to the pixel electrode 710 for light emission of the organic emission layer 720 of the OLEDs 70 in selected pixels. The driving gate electrode 155 is connected to the first capacitive plate 158. The driving source electrode 176 and the second capacitive plate 178 are respectively connected to the common power line 172. The driving drain electrode 177 is connected to the pixel electrode 710 of the OLED 70 through a contact hole 182.

With the above-described structure, the switching thin film transistor 10 is driven to transmit a data voltage applied to the data line 171 to the driving thin film transistor 20 by a gate voltage applied to the gate line 151. A voltage that corresponds to a voltage difference between a common voltage transmitted from the common power line 172 to the driving thin film transistor 20 and the data voltage transmitted from the switching thin film transistor 10 is stored in the capacitor 80, and a current corresponding to the voltage stored in the capacitor 80 flows to the OLED 70 through the driving thin film transistor 20 so that the OLED 70 emits light.

The second substrate 210 is positioned opposite to the first substrate 110, and covers the thin film transistors 10 and 20, the capacitor 80, and the OLED 70 from an external environment. The second substrate 210 includes a second substrate member 211 and corner-cube pattern 215 formed on a side of the second substrate member 211 facing the first substrate 110.

The corner-cube pattern 215 may reflect most of the incident light that reaches the second substrate 210 from the external environment back in a direction opposite and substantially parallel to a direction of the incident light. That is, a direction of incident light IR to the corner-cube pattern 215 and a direction of reflected light RR reflected from the corner-cube pattern 215 may be substantially parallel to each other.

In this case, since light reflected from the corner-cube pattern 215 is transmitted toward the outside in a substantially opposite direction to the incident direction, reflection of the external light toward a user who is facing the OLED display 100 may be suppressed or reduced. Therefore, visibility of the OLED display 100 may be improved. On the other hand, most of the light emitted from the OLED 70 may be passed through the corner-cube pattern 215 and emitted to the outside.

As described, deterioration of visibility of the OLED display 100 due to reflection of external light may be suppressed or reduced by using the corner-cube pattern 215 of the second substrate 210, and light generated from the OLED 70 may concurrently be emitted to the outside with minimal or very little light loss.

Hereinafter, a structure of the OLED display 100 according to the first exemplary embodiment of the present invention will be described in further detail in a stack order. In addition, a structure of a thin film transistor will be described with reference to the driving thin film transistor 20. Further, details of switching thin film transistor 10 may be described more fully with respect to differences from the driving thin film transistor 20.

First, the first substrate 110 will be described. A first substrate member 111 is formed as an insulation substrate made of, for example, glass, quartz, ceramic, plastic, etc. However, the present invention is not limited thereto. Therefore, the first substrate member 111 may be formed, for example, as a metal substrate that is made of stainless steel.

A buffer layer 120 is formed on the first substrate member 111. The buffer layer 120 prevents or reduces impurities from permeating and planarizes a surface, and may be made of various materials for performing such functions. For example, at least one of a silicon nitride (SiNx) layer, a silicon dioxide (SiO2) layer, or a silicon oxynitride (SiOxNy) layer may be used as the buffer layer 120. However, the buffer layer 120 is not always necessary, and may be omitted according to type and process conditions of the first substrate member 111.

The driving semiconductor is formed on the driving buffer layer 120. The driving semiconductor layer 132 is formed of a polysilicon layer. In addition, the driving semiconductor layer 132 includes a channel region 135 in which impurities are not doped, and a source region 136 and a drain region 137 that are doped with p+ impurities at respective sides of the channel region 135. In this case, a doped ion material is a P-type impurity such as boron (B), and $B_2H_6$ is generally used as the doped ion material. The impurity changes in accordance with the type of thin film transistor.

In the first exemplary embodiment of the present invention, a PMOS-structured thin film transistor using the P-type impurity is used as the driving thin film transistor 20, but is not limited thereto. Therefore, an NMOS-structured thin film transistor or a CMOS-structured thin film transistor may both be used as the driving thin film transistor 20.

In addition, although the driving film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The gate insulation layer 140, made of silicon nitride (SiNx) or silicon dioxide (SiO2), is formed on the driving semiconductor layer 132. A gate layer including the driving gate electrode 155 is formed on the gate insulating layer 140. The gate layer further includes the gate line 151, the first capacitive plate 158, and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulation layer 140, the interlayer insulating layer 160 may be made of silicon nitride (SiNx) or silicon dioxide (SiO2).

A data layer including the driving source electrode 176 and the driving drain electrode 177 is formed on the interlayer insulating layer 160. The data layer further includes the data line 171, the common power line 172, the second capacitive plate 178, and other wires. In addition, the driving source electrode 176 and the driving drain electrode 177 are respectively connected to the source region 136 and the drain region 137 of the driving semiconductor layer 132 through the through-holes respectively formed in the interlayer insulation layer 160 and the gate insulation layer 140.

As described, the driving thin film transistor 20 including the driving semiconductor layer 132, the gate electrode 155, the driving source electrode 176, and the driving drain electrode 177 is formed. A configuration of the driving thin film transistor 20 is not limited to the above-described embodiment, and may be variously modified with a configuration that can be realized by a person of ordinary skill in the art.

A planarization layer 180 that covers data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 may be made of at least one of polyacrylate resin, epoxy resin, phenolic resin, polyamide resin, polyimide resin, unsaturated polyesters resin, poly phenylenether resin, poly phenylenesulfide resin, or benzocyclobutene (BCB).

The first exemplary embodiment of the present invention is not limited to the above-described structure. For example, one of the planarization layer 180 or the interlayer insulating layer 160 may be omitted as necessary.

The pixel electrode 710 of the OLED 70 is formed on the planarization layer 180. That is, in the OLED display 100, a plurality of pixel electrodes 710 are disposed in corresponding pixels. In this case, the plurality of pixel electrodes 710 are respectively disposed at a distance from each other. The pixel electrode 710 is connected to the drain electrode 177 through the contact hole 182 of the planarization layer 180.

In addition, a pixel defining layer 190 having an opening that exposes the pixel electrode 710 is formed on the planarization layer 180. That is, the pixel defining layer 190 serves as a boundary area for each pixel and includes a plurality of openings defining each pixel. In addition, the pixel electrodes 710 correspond to the openings of the pixel defining layer 190, but it is not limited thereto. That is, the pixel electrodes 710 may also extend to under the pixel defining layer 190 to be partially overlapped by the pixel defining layer 190. The pixel defining layer 190 may be made of an inorganic material of a resin or silica group such as polyacrylate resin and polyimide.

The organic emission layer 720 is formed on the pixel electrode 710, and the common electrode 730 is formed on the organic emission layer 720. As described, the OLED 70 including the pixel electrode 710, the organic emission layer 720, and the common electrode 730 is formed.

The organic emission layer 720 is made of either a low-molecular organic material or a high-molecular organic material. The organic emission layer 720 is formed in a multi-layer structure including at least one of a hole injection layer (HIL), a hole transport layer (HTL), an emission layer, an electron transport layer (ETL), or an electron injection layer (EIL). When the organic emission layer 720 is formed in a multilayer structure including all the layers HIL, HTL, ETL, and EIL, the HIL is formed on the pixel electrode 710 which is a positive electrode and the HTL, ETL, and EIL are sequentially stacked thereon.

In addition, in FIG. 2, the organic emission layer 720 is disposed only in the opening of the pixel defining layer 190 according to the first exemplary embodiment of the present invention, but is not limited thereto. That is, the organic emission layer 720 may be formed not only on the pixel electrode 190 in the opening of the pixel defining layer 190, but may also extend to between the pixel defining layer 190 and the common electrode 730.

In further detail, the organic emission layer 720 may further include several layers including an emission layer, an HIL, an HTL, an ETL, and an EIL. In this case, like the common electrode 730, excluding the emission layer, the HIL, HTL, ETL, and EIL may be formed not only on the pixel electrode 710 but also on the pixel defining layer 190 by using an open mask in a manufacturing process. That is, at least one of the layers included in the organic emission layer 720 may be interposed between the pixel defining layer 190 and the common electrode 730.

Each of the pixel electrode 710 and the common electrode 730 may be made of a transparent conductive material, or a transflective or reflective conductive material. According to materials of the pixel electrode 710 and the common electrode 730, the OLED display 100 may be classified as a top light emitting type, a bottom light emitting type, or a dual-side light emitting type.

The OLED display 100 according to the first exemplary embodiment of the present invention is a top light emitting type of OLED display. That is, the OLED 70 emits light toward the second substrate 210 to display an image.

For the transparent conductive material, indium tin oxide (ITO), indium zinc oxide (IZO), zinc oxide (ZnO), or indium oxide (In2O3) may be used. For the reflective or transflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) may be used.

The second substrate 210 is formed on the common electrode 730. The second substrate member 211 may include a second substrate member 211 that is made of a transparent material, such as glass or plastic. In addition, a corner-cube pattern 215 of the second substrate 210 protrudes toward the common electrode 730. Although it is not shown, the second substrate 210 is bonded to the first substrate 110 by a sealing material formed along an edge of the second substrate 210 to seal a space between the first and second substrates 110 and 210.

Figure 3:
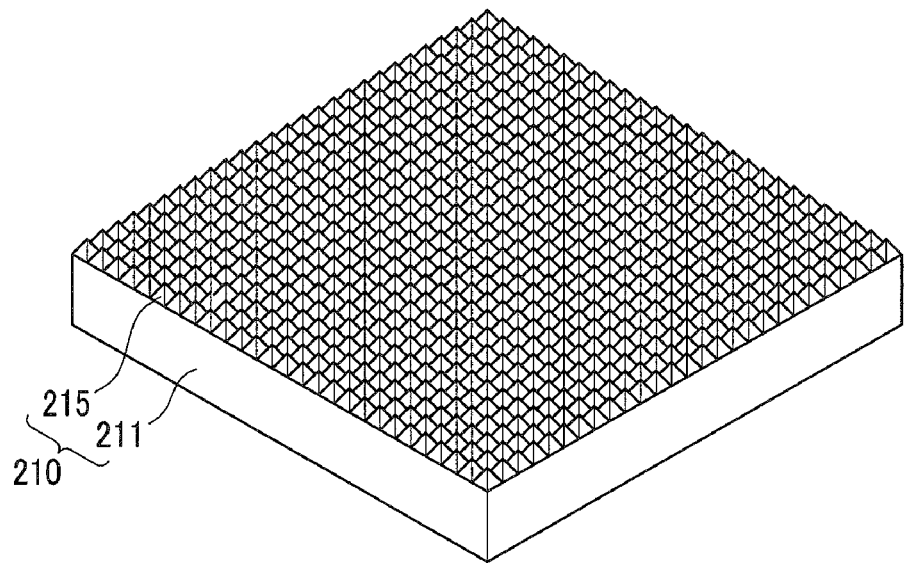
FIG. 3 is a perspective view of a second substrate on which a corner-cube pattern is formed.
Figure 4:
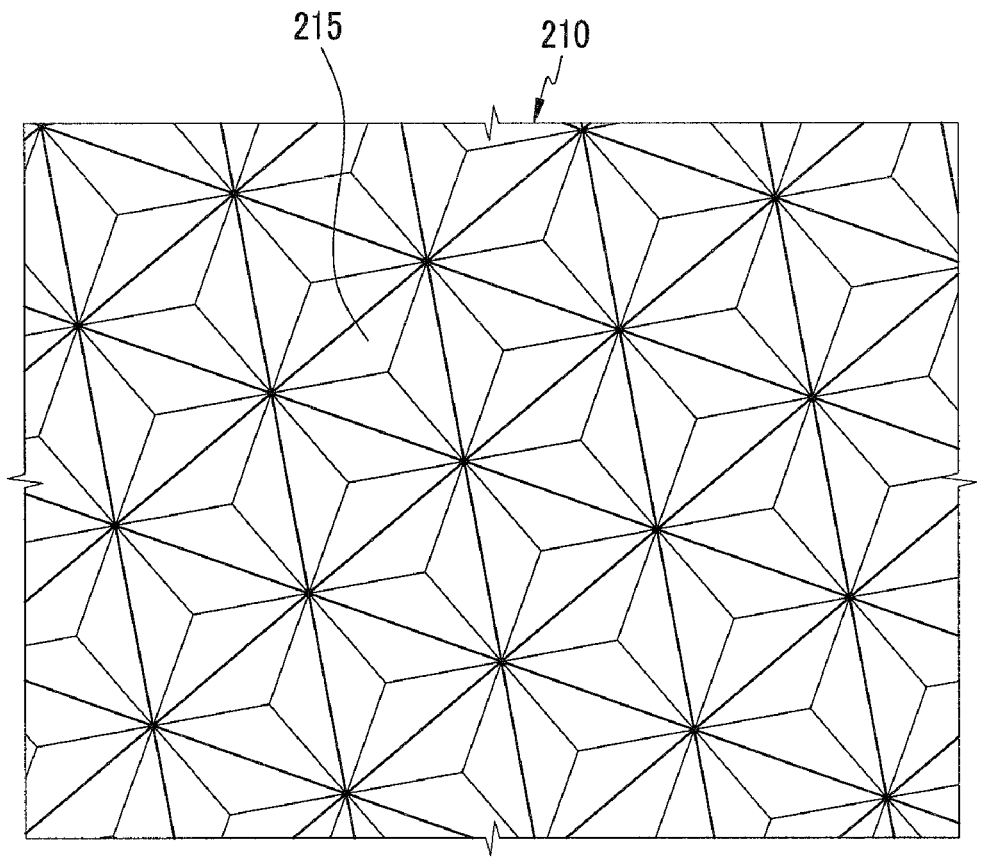
FIG. 4 is a top-plan view of the corner-cube pattern of FIG. 3.

As shown in FIG. 3 and FIG. 4, the corner-cube pattern 215 may be formed as a plurality of trihedrons. FIG. 3 is a perspective view illustrating the corner-cube pattern 215 of the second substrate 210, and FIG. 4 is a top plan view of the corner-cube pattern 215. In further detail, a corner-cube may be a trihedral structure having unique optical characteristics in that an incident beam or incident light entering the effective aperture is reflected in a direction substantially opposite an incident direction regardless of the incident angle. In other words, the corner-cube is a cube with a cut-off corner, that is, it has a substantially triangular pyramid shape. The corner-cube pattern 215 including the corner-cubes may be formed on the second substrate 210 in a micro unit pattern.

In addition, the corner-cube pattern 215 may be formed by various known methods. For example, the corner-cube pattern 215 may be formed by performing fine grinding and polishing of a drawn hexagonal stainless pin with a desired size and a desired angle to make a surface roughness of a quarter of a visible ray wavelength. In addition, the corner-cube pattern 215 may be formed by performing laser ablation with an excimer laser.

In addition, as shown in FIG. 2, an air layer 250, or a gap including air or another suitable gaseous matter, is formed in a space between the first substrate 210 and the second substrate 210. The second substrate 210 is made of a material having a refractive index that is greater than a refractive index of the air layer 250.

In the above-described structure, the corner-cube pattern 215 of the second substrate 210 reflects most of the incident light passing the second substrate 210 from the external environment back toward the incident direction in a substantially parallel direction to the incident direction. In this case, since light reflected from the corner-cube pattern 215 is transmitted toward the outside in a substantially opposite direction to the incident direction, reflection of the external light toward a user who is facing the OLED display 100 may be suppressed or reduced. Accordingly, visibility of the OLED display 100 may be improved. Meanwhile, most of the light emitted from the OLED 70 passes through the corner-cube pattern 215 and emitted without being reflected.

In addition, the second substrate 210 may be made of a transparent material such as glass. Therefore, the corner-cube pattern 215 may also be transparent. As described, in order to make a direction of the incident light of the corner-cube pattern 215 substantially parallel to a direction of the reflected light of the corner-cube pattern 215, a material having a refractive index that is lower than that of the corner-cube pattern 215 (that is, the second substrate 210) should contact a surface that is opposite an incident light surface of the corner-cube pattern 215. According to the first exemplary embodiment of the present invention, the air layer 250 having a refractive index that is lower than that of the second substrate 210 contacts the corner-cube pattern 215. For example, the refractive index of the air layer 250 is 1 and the refractive index of the second substrate 210 is 1.4~1.5.

Figure 5:
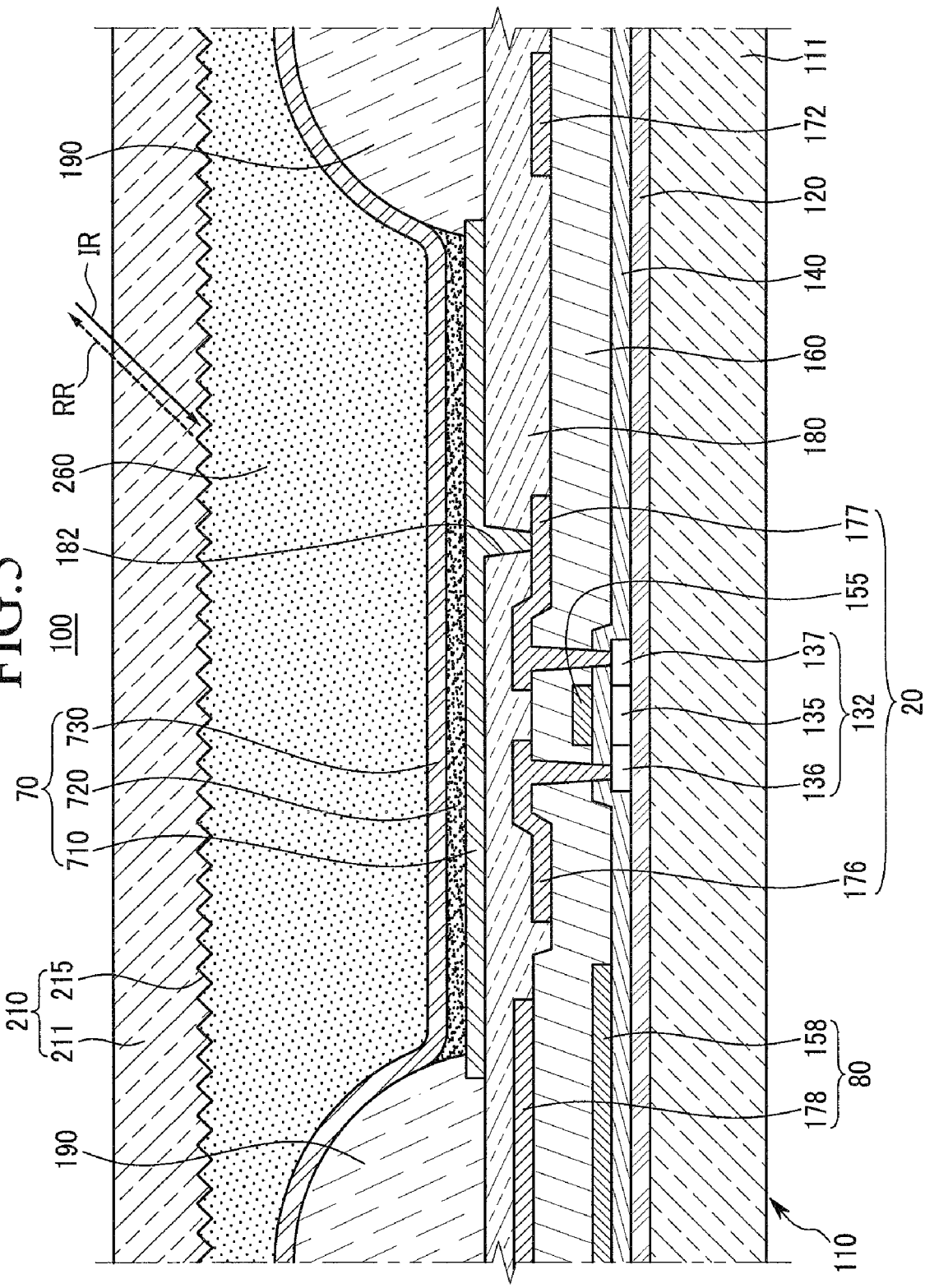
FIG. 5 is a cross-sectional view of a modified embodiment of the first exemplary embodiment of the present invention.

However, the first exemplary embodiment of the present invention is not limited thereto. Therefore, as shown in FIG. 5, instead of the air layer 250, a filler 260 may contact the corner-cube pattern 215 of the second substrate 210. That is, the filler 260, rather than the air layer 250, may be filled between the first substrate 110 and the second substrate 210. However, like the air layer 250, a refractive index of the filler 260 may be lower than that of the second substrate 210. In addition, the filler 260 may be made of a transparent material.

With the above-described configuration, the OLED display 100 may have improved visibility. That is, the OLED display 100 may suppress or reduce deterioration of visibility due to reflection of external light by using the corner-cube pattern 215 of the second substrate 210. In addition, the OLED display 100 may emit light generated from the OLED 70 to the outside with minimal or very little light loss.

Accordingly, the OLED display 100 may improve visibility and reduce power consumption by increasing the efficiency of the use of generated light.

Hereinafter, a second exemplary embodiment of the present invention will be described with reference to FIG. 6 and FIG. 7.

Figure 6:
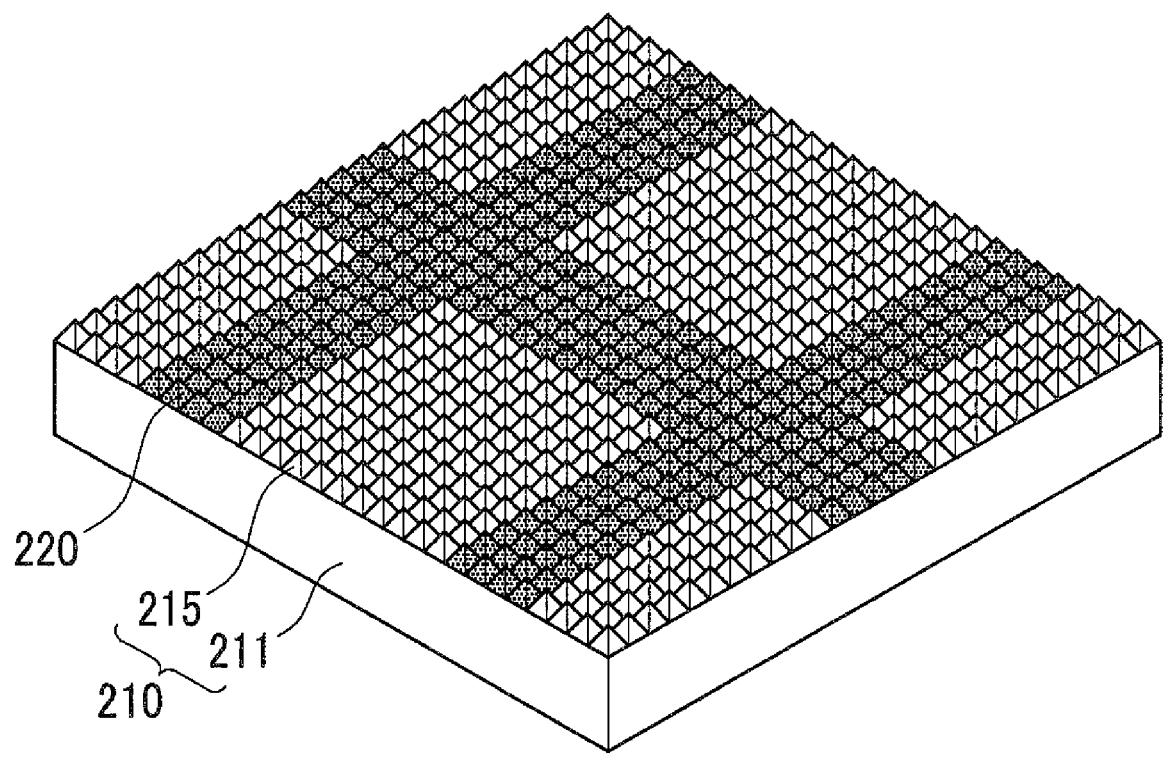
FIG. 6 is a perspective view of a second substrate of an OLED display according to a second exemplary embodiment of the present invention.

As shown in FIG. 6, a second substrate 210 according to the second exemplary embodiment of the present invention includes a second substrate member 211, a corner-cube pattern 215 formed on one side of the second substrate member 221, and a light blocker 220.

Figure 7:
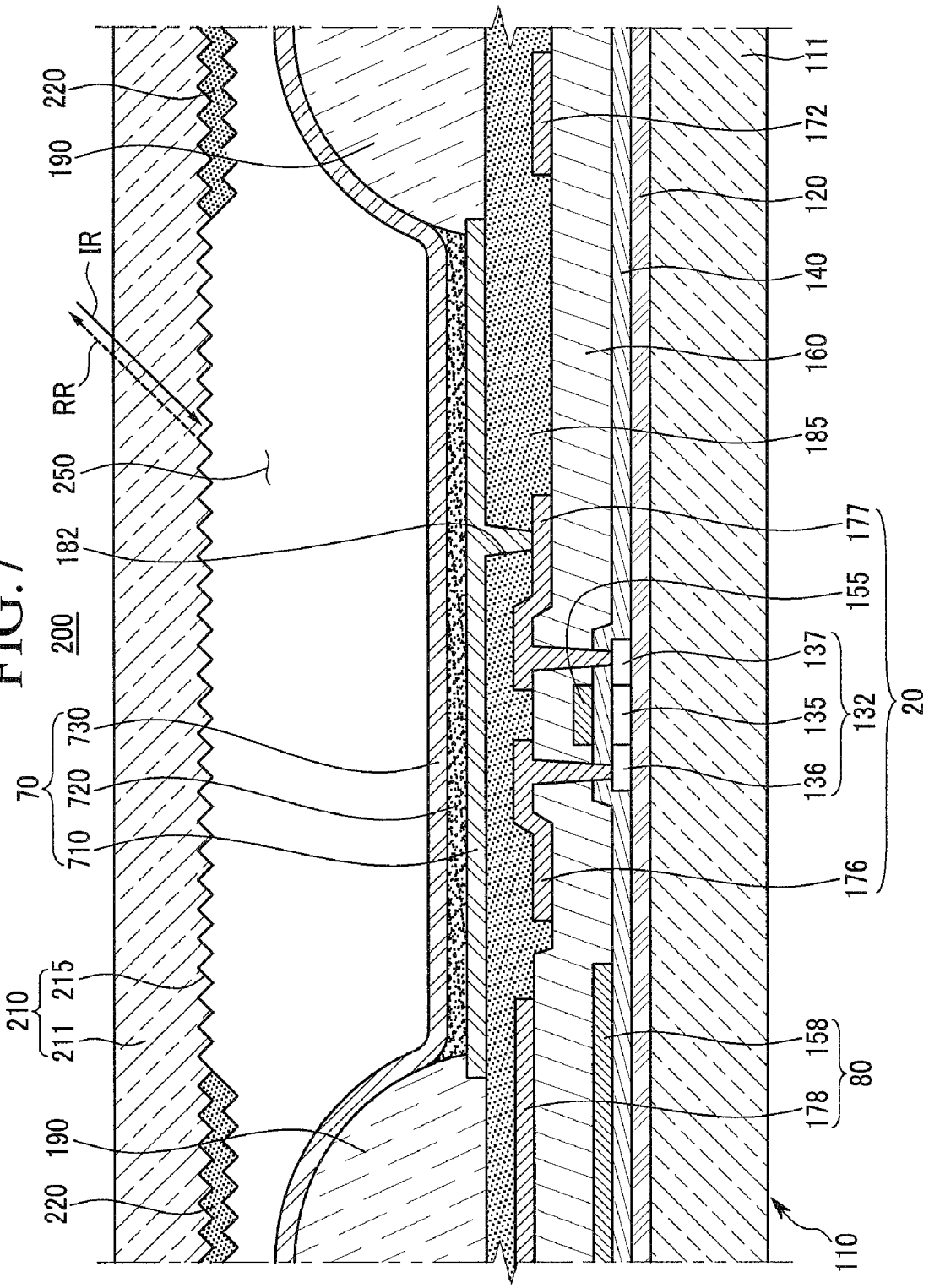
FIG. 7 is a cross-sectional view of the OLED display of FIG. 6.

As shown in FIG. 7, the corner-cube pattern 215 of the second substrate 210 is protruded toward a first substrate 110. The corner-cube pattern 215 reflects most of the incident light to the second substrate 210 from an external environment back toward the incident direction in a direction opposite and substantially parallel to the incident direction. That is, a direction of incident light IR to the corner-cube pattern 215 and a direction of reflected light RR of the corner-cube pattern 215 may be substantially parallel to each other.

The light blocker 220 is formed along boundaries of the plurality of pixels of the first substrate 110. In further detail, the light blocker 220 is formed to correspond to non-light emitting areas of each pixel. Here, the non-light emitting areas refer to areas where an organic emission layer 720 does not emit light. That is, in each pixel, areas excluding overlapping portions of the pixel electrode 710 and the organic emission layer 720 are the non-light emitting areas. In other words, the non-light emitting areas may correspond to areas where the pixel defining layer 190 is formed. The pixel defining layer 190 may correspond to boundary areas between neighboring pixels.

The light blocker 220 may be made of a metallic material for blocking light, or may be made of a photosensitive organic material with black-based pigment or an organic material. Here, carbon black or titanium oxide may be used as a black-based pigment. However, the second exemplary embodiment of the present invention is not limited thereto, and the light blocker 220 may be made by using various known methods.

In addition, in FIG. 7, the light blocker 220 of the second substrate 210 is formed on a side that faces the first substrate, that is, the light blocker 220 and the corner-cube pattern 215 are formed on the same side, but the second exemplary embodiment of the present invention is not limited thereto. Therefore, the light blocker 220 may be formed on a side opposite the side on which the corner-cube pattern 215 is formed.

With the above-described configuration, the OLED display 200 may have further improved visibility. Specifically, the OLED display 200 may have improved contrast.

Hereinafter, a third exemplary embodiment of the present invention will be described with reference to FIG. 8.

Figure 8:
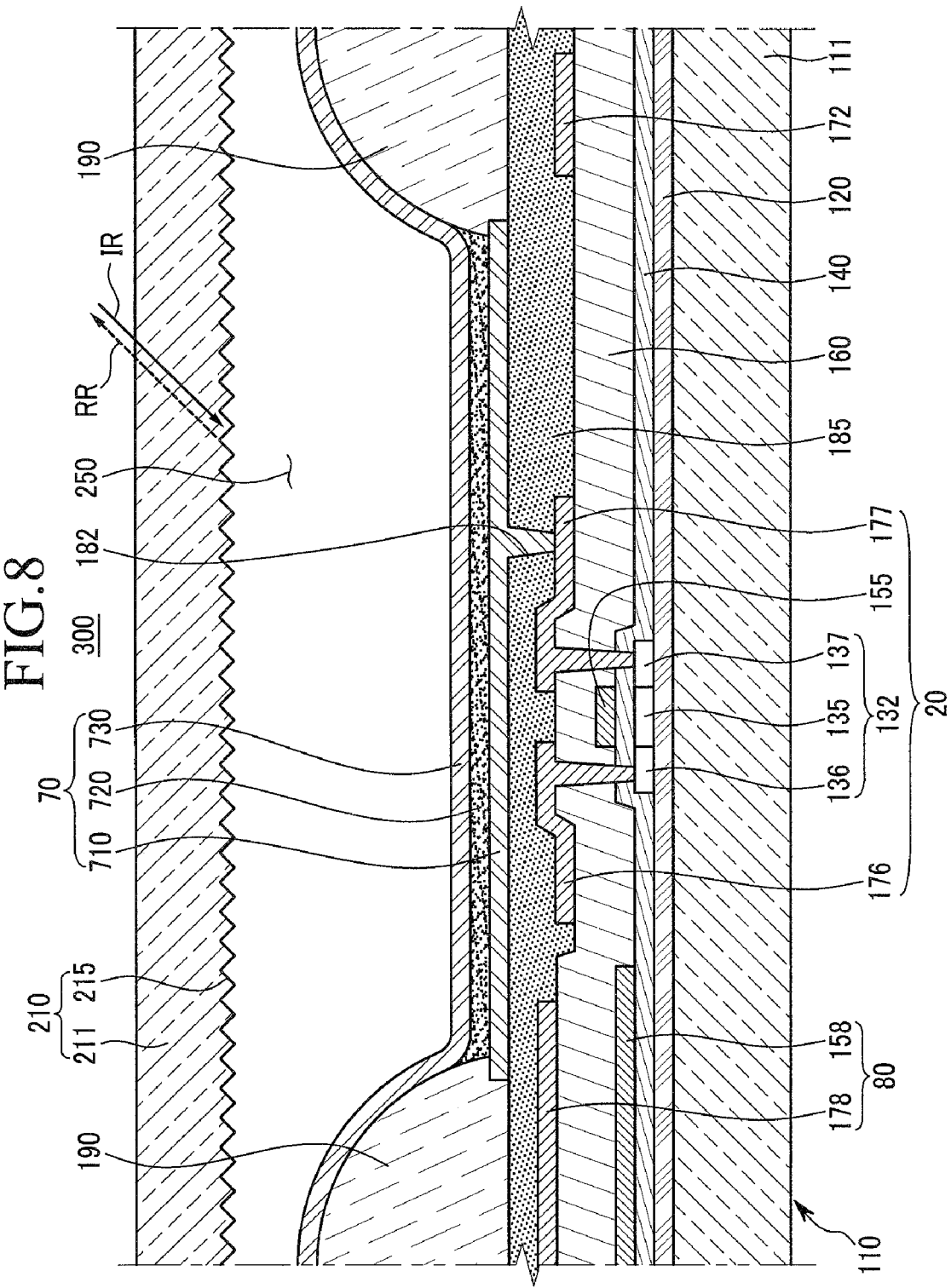
FIG. 8 is a cross-sectional view of an OLED display according to a third exemplary embodiment of the present invention.

As shown in FIG. 8, a planarization layer 185 of an OLED display 300 according to the third exemplary embodiment of the present invention may have a gray or dark-based color with low brightness. That is, the planarization layer 185 may be made by combining a light absorbing material such as carbon black or titanium oxide with several resin materials having planarization characteristics. Accordingly, the planarization layer 185 may function as a light absorbing layer. Therefore, the planarization layer 185 may partially absorb incident light that is transmitted through a corner-cube pattern 215 of a second substrate 210 from the external environment so that reflection of incident light may be further suppressed or reduced.

The corner-cube pattern 215 reflects incident light from the external environment entering the second substrate 210 back toward a direction substantially parallel to an incident direction. That is, a direction of incident light IR to the corner-cube pattern 215 and a direction of reflected light RR from the corner-cube pattern 215 may be substantially parallel to each other.

Therefore, visibility of the OLED display 300 may be further improved.

While this invention has been described in connection with what is presently considered to be practical exemplary embodiments, it is to be understood that the invention is not limited to the disclosed embodiments, but is instead intended to cover various modifications and equivalent arrangements included within the spirit and scope of the appended claims.

What is claimed is:

1. An organic light emitting diode (OLED) display comprising:
   a first substrate comprising a thin film transistor and an organic light emitting diode (OLED);
   a second substrate arranged on the first substrate along a first direction and comprising a corner-cube pattern facing the first substrate; and
   only one single uniform layer arranged along the first direction between the corner-cube pattern of the second substrate and portions of the first substrate including the OLED.

2. The OLED display of claim 1, wherein the corner-cube pattern comprises a plurality of trihedrons protruding toward the first substrate.

3. The OLED display of claim 1, wherein a gap including a gas is between the first and second substrates, wherein the gas is in contact with the corner-cube pattern, and wherein a refractive index of the second substrate is greater than a refractive index of the gas.

4. The OLED display of claim 1, wherein a filler is between the first and second substrates and in contact with the corner-cube pattern, and wherein a refractive index of the filler is less than a refractive index of the second substrate.

5. The OLED display of claim 1, wherein the OLED of the first substrate displays an image by emitting light toward the second substrate.

6. The OLED display of claim 1, wherein the first substrate further comprises a plurality of pixels, each of the plurality of pixels comprising a corresponding OLED and a boundary around the corresponding OLED, and wherein the second substrate further comprises a light blocker covering the boundaries of the plurality of pixels.

7. The OLED display of claim 6, wherein the light blocker faces the first substrate.

8. The OLED display of claim 1, wherein the first substrate further comprises a planarization layer between the thin film transistor and the OLED, and wherein the planarization layer has a gray or dark-based color.

9. The OLED display of claim 1, wherein the corner-cube pattern is configured to reflect incident light back in a direction substantially parallel to a direction of the incident light.

10. A pixel of an organic light emitting diode (OLED) display comprising:
    a first substrate comprising a thin film transistor, a planarization layer on the thin film transistor, an organic light emitting diode (OLED) on the planarization layer, and a boundary around the OLED;
    a second substrate arranged on the first substrate along a first direction and comprising a corner-cube pattern facing the first substrate; and
    only one single uniform layer arranged along the first direction between the corner-cube pattern of the second substrate and portions of the first substrate including the OLED.

11. The pixel of claim 10, wherein the corner-cube pattern comprises a plurality of trihedrons protruding toward the first substrate.

12. The pixel of claim 10, wherein a gap including a gas is between the first and second substrates, wherein the gas is in contact with the corner-cube pattern, and wherein a refractive index of the second substrate is greater than a refractive index of the gas.

13. The pixel of claim 10, wherein a filler is between the first and second substrates and in contact with the corner-cube pattern, and wherein a refractive index of the filler is less than a refractive index of the second substrate.

14. The pixel of claim 10, wherein the OLED of the first substrate displays an image by emitting light toward the second substrate.

15. The pixel of claim 10, wherein the second substrate further comprises a light blocker covering the boundary.

16. The pixel of claim 15, wherein the light blocker faces the first substrate.

17. The pixel of claim 10, wherein the planarization layer has a gray or dark-based color.

18. The pixel of claim 10, wherein the corner-cube pattern is configured to reflect incident light back in a direction substantially parallel to a direction of the incident light.

* * * * *